United States Patent [19]

Okada et al.

[11] Patent Number: 4,667,120
[45] Date of Patent: May 19, 1987

[54] INTEGRATED FILTER CIRCUIT WITH VARIABLE FREQUENCY CHARACTERISTICS

[75] Inventors: Yoshinori Okada; Isao Fukushima, both of Katsuta; Kuniaki Miura, Ibaraki; Kenji Kano, Mito, all of Japan

[73] Assignee: Hitachi, Ltd., Tokyo, Japan

[21] Appl. No.: 721,867

[22] Filed: Apr. 10, 1985

[30] Foreign Application Priority Data

Apr. 11, 1984 [JP] Japan ................... 59-70828

[51] Int. Cl.[4] .......... H03K 5/00; H03K 3/20; H03B 1/00
[52] U.S. Cl. ..................... 307/521; 307/320; 328/167; 328/149
[58] Field of Search ............ 307/520, 320, 521; 328/167, 162, 149; 330/254, 284

[56] References Cited

U.S. PATENT DOCUMENTS

| | | | |
|---|---|---|---|
| 3,562,675 | 2/1971 | Urell | 307/521 |
| 3,761,741 | 6/1972 | Hoeft | 307/567 |
| 3,946,249 | 3/1976 | Nagami et al. | 307/521 |
| 3,969,678 | 7/1976 | Asahara et al. | 307/320 |
| 3,986,154 | 10/1976 | Yamada et al. | 307/320 |
| 4,316,108 | 2/1982 | Rogers, Jr. | 307/521 |

Primary Examiner—Stanley D. Miller
Assistant Examiner—Timothy P. Callahan
Attorney, Agent, or Firm—Antonelli, Terry & Wands

[57] ABSTRACT

A filter integrated circuit having a reference level generator circuit for attenuating its input signal and generating a reference level signal, a pseudofilter circuit including resistors and a variable capacitor as filter elements, and an error amplifier unit for comparing the level of the output signal of the reference level generator circuit with the level of the output signal of the pseudofilter circuit and for generating an automatic adjustment control signal in accordance with the level difference between the output signals. The automatic adjustment control signal is supplied to the pseudofilter circuit to change the capacitance value of the variable capacitor in the pseudofilter circuit so that the output signal level of the pseudofilter circuit may become equal to the level of the reference signal. The automatic adjustment control signal is also supplied to at least one filter circuit to change the capacitance of a variable capacitor included therein. As a result, the deviation in the filter characteristics caused by deviations in the resistance of a resistor and in the capacitance of the capacitor is corrected.

4 Claims, 12 Drawing Figures

INTEGRATED FILTER CIRCUIT WITH VARIABLE FREQUENCY CHARACTERISTICS

BACKGROUND OF THE INVENTION

The present invention relates to a filter integrated circuit suitable for integration of a filter into a monolithic IC formed on a silicon wafer or the like.

As lowpass, highpass and bandpass filters or phase equalizers for producing desired signals in conventional electronic circuits, block filters having discrete components of inductance L, capacitance C and resistance R have been widely used. As more and more electronic circuits are realized as integrated circuits (monolithic IC's), these filters become obstacles to cost reduction and reduction of size and weight of electronic circuits. Especially for portable devices in which mobility is an important factor, reduction in size and weight is important and it is demanded to realize filters in the form of integrated circuits.

Since it is difficult to realize the inductance L as an integrated circuit, filters suitable for integration are active filters which can be formed by using only the capacitance C and resistance R. For example, twin-T-shaped trap filters can be formed by using only capacitors and resistors. The trap frequency fr of such a filter is represented as $$fr = 1/2\pi C_a R_a$$

where Ca is the capacitance of the capacitor used in the twin-T-shaped trap filter and Ra is the resistance of the resistor used in that filter.

When such a trap filter is to be integrated, deviations in the capacitance value and the resistance value pose a problem. That is to say, the values of the capacitance and resistance in the IC are affected by deviations in the impurity concentrations and mask alignment etc. For example, the absolute value of the capacitance varies by ±10 to 15% and the absolute value of the resistance varies by ±10%. These deviations are rather large values. In the above described example, therefore, the trap frequency of the integrated twin-T-shaped trap filter also varies by ±20 to 25% in the worst case, the practical use being extremely difficult. In accordance with a countermeasure disclosed in Japanese Patent Publication No. 58083/82, the resistance value of the resistor located on the IC chip is changed by using the laser trimming to correct the deviation. Although this countermeasure has been used, many problems still remain with respect ot the precision and the yield rate.

In variable attenuation circuits disclosed in Japanese Patent Publication No. 58083/82 and U.S. Pat. No. 3,761,741, the fact that the emitter resistance of the transistor is varied by a change in the DC current is used. It is known that the variation in the filter characteristics caused by deviations of element values of the IC can be corrected by using the similar technique. However, it is difficult to apply this technique to all filters including trap filters. In addition, deviations of elements of the IC must be corrected by external adjustment, resulting in a higher cost.

SUMMARY OF THE INVENTION

An object of the present invention is to provide a filter integrated circuit which is capable of automatically correcting the variation in the filter characteristics caused by deviations in the integrated capacitance and the integrated resistance without requiring any external adjustment ot ensure the predetermined performance and which is free from the above described problems of the prior art.

A filter integrated circuit in accordance with the present invention comprises a reference level generator circuit for receiving an input signal having a reference frequency and for generating a reference level signal, a pseudofilter circuit filtering said input signal and comprising an integrated resistor and an integrated capacitor having a variable capacitance value, an error amplifier unit for receiving the output signal of said reference level generator and the output signal of said pseudofilter circuit and for generating an automatic adjustment control sinal in accordance with the level difference between those output signals, means for supplying the automatic adjustment control signal to the pseudofilter circuit and for thereby changing the capacitance value of the variable capacitor so that the level of the output signal of the pseudofilter circuit may become equal to the level of the reference level signal, and a filter circuit including an integrated resistor and an integrated variable capacitor which respectively have high ratio precision with respect to the corresponding elements of the pseudofilter circuit, i.e., the resistor and the capacitor of the pseudofilter circuit. The automatic adjustment control signal is supplied to the filter circuit to change the capacitance value of the variable capacitor thereof so as to correct the deviation in the filter characteristics.

Here, the ratio precision refers to the precision of a ratio between values of circuit components. For example, when the ratio between resistance values of two resistors remains unchanged even if individual resistance values deviated fromj their nominal values, it is said that the ratio precision is high. This holds true also for capacitance values. In a semiconductor integrated circuit, high ratio precision between circuit component values on one chip can be obtained although individual values deviate from their nominal values.

In a filter integrated circuit in accordance with the present invention, the automatic adjustment control signal is generated to make the output signal level of the pseudofilter circuit equal to the reference value. That is to say, the automatic adjustment control signal corrects the deviation in the filter characteristics of the pseudofilter circuit caused by deviations in the element values and the automatic adjustment control signal is concurrently supplied to the filter circuit. The ratio precision between an element value of the filter circuit and the corresponding element value of the pseudofilter circuit is high. If the filter characteristics of the pseudofilter circuit vary due to deviations in the element values, therefore, the filter characteristics of the filter circuit vary in the same way as the pseudofilter circuit. Accordingly, it is possible to correct the deviation in the characteristics of the filter circuit by using the automatic adjustment control signal which is used to correct the deviation in the characteristics of the pseudofilter circuit.

In the filter integrated circuit, the reference level generator circuit can be formed by a plurality of integrated resistors or external resistors having high ratio precision so as to attenuate the reference input signal by using those resistors to produce the reference level signal. The error amplifier unit can be composed of a detector circuit for detecting the output signal of the reference level generator circuit, another detector circuit for detecting the output signal of the pseudofilter circuit, and an amplifier for receiving the output signals of both detector circuits, amplifying the level difference between those output signals, and generating the automatic adjustment control signal. The frequency of the input signal to the filter integrated circuit may be variable. In this case, automatic adjustment is carried out for signals of respective frequencies.

In accordance with the present invention, the deviation in the characteristics of a filter comprising an integrated resistor and an integrated variable capacitor as elements contained in a semiconductor integrated circuit is automatically adjusted. And it is possible to improve the precision of the filter and eliminate the adjustment which has been heretofore conducted filter by filter. In accordance with the present invention, therefore, a large-sized block filter which has heretofore been used as an external part can be integrated without requiring adjustment. As a result, it becomes possible to reduce the cost of circuits in the filter unit as well as the size, weight and the number of parts of the unit.

BRIEF DESCRIPTION OF THE DRAWINGS

These and other objects and advantages of the present invention will become apparent by reference to the following description and accompanying drawings wherein.

DESCRIPTION OF PREFERRED EMBODIMENTS

Figure 1:
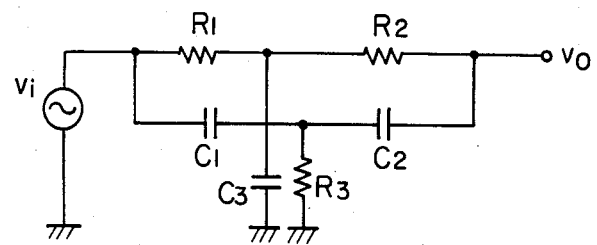
FIG. 1 is a circuit diagram of a twin-T-shaped trap filter.

Prior to description of an embodiment of the present invention, the configuration of a twin-T-shaped trap filter suitable to integration will now be described. FIG. 1 shows the configuration of a well-known twin-T-shaped trap filter. If resistance and capacitance values of FIG. 1 are chosen as $$R_1 = R_2 = 2R_3 = Ra$$

$$C_1 = C_2 = C_3/2 = Ca,$$

it follows that $fr = 1/2\pi CaRa$. In FIG. 1, $v_i$ is an input signal and $v_o$ is an output signal.

Figure 2:
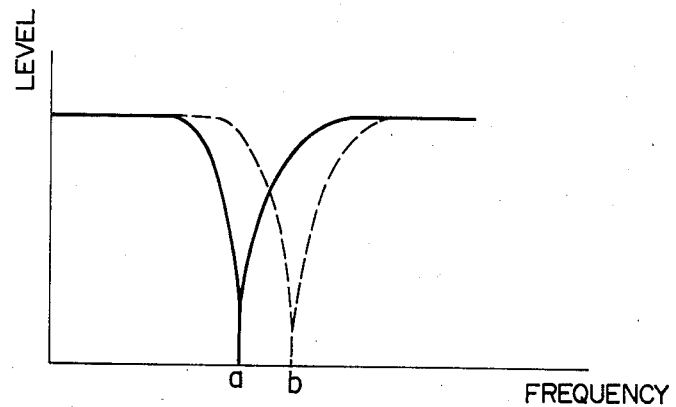
FIG. 2 is a characteristic diagram for illustrating the deviation in the frequency characteristics of the filter illustrated in FIG. 1.

When a trap filter is intergrated, the trap frequency is deviated as result of deviations in the capacitance and resistance values of the integrated circuit. In the integrated circuit, the absolute value of the capacitance may vary as much as ±10 to 15% and the absolute value of the resistance may vary as much as ±10%. In this case, the trap frequency fr of the trap filter illustrated in FIG. 1 varies as much as ±20 to 25% in the worst case. FIG. 2 shows that the trap frequency varies in range extending from a to b as a result of variation in the resistance and capacitance values of the filter circuit illustrated in FIG. 1. The present invention provides a filter integrated circuit having a function of automatically correcting such variation of the trap frequency of the trap filter.

Figure 3:
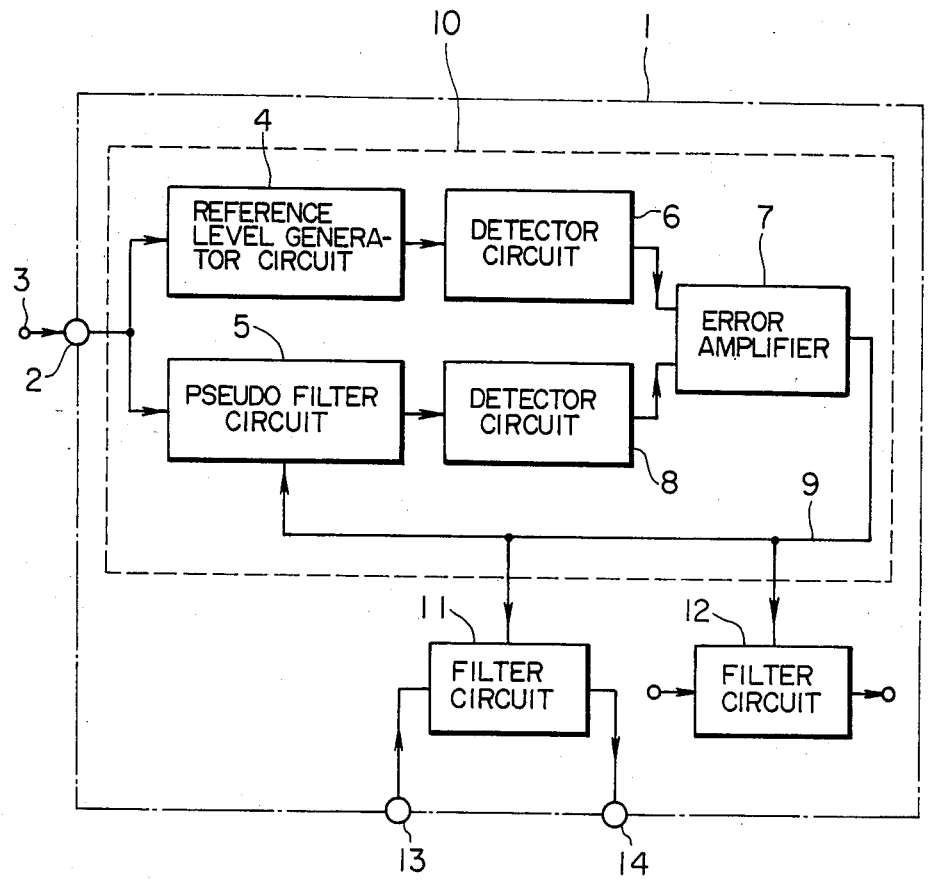
FIG. 3 is a block diagram for illustrating the configuration of an embodiment of a filter integrated circuit according to the present invention.

Embodiments of the present invention will now be described by referring to drawings. FIG. 3 is a block diagram for illustrating the configuration of an embodiment of a filter circuit according to the present invention. In FIG. 3, a signal 3 having a constant reference frequency fin is applied to an IC pin 2 of an IC 1. The input signal 3 is applied to a reference level generator circuit 4 and a pseudofilter circuit 5 in the IC 1. The reference level generator circuit 4 attenuates the input signal to produce a reference level signal. The reference level signal is detected in a detector circuit and the detected output is fed to one input terminal of an error amplifier 7. The pseudofilter circuit 5 is a filter circuit comprising a resistor and a variable capacitor (provided by a varactor) as elements. The pseudofilter circuit 5 filters the input signal and supplies the filtered signal to a detector circuit 8. The detector circuit 8 detects the signal and supplies the detected signal to the other input terminal of the error amplifier 7. The error amplifier 7 amplifies the level difference between the output of the detector circuit 6 and the output of the detector circuit 8. The resultant voltage signal is supplied to the varactor diode in the pseudofilter circuit 5 via a lead 9. In the pseudofilter circuit 5, the voltage signal supplied from the error amplifier 7 changes the capacitance value of the varactor diode to change the filter characteristics so that the level of the filtered signal level will be equal to that of the reference signal level supplied from the reference level generator circuit 4. The reference level generator circuit 4, the pseudofilter circuit 5, the detector circuits 6 and 8, and the error amplifier 7 constitute an automatic adjustment control signal generator circuit 10. The automatic adjustment control voltage signal supplied from the error amplifier 7 adjusts and corrects the deviation in the filter characteristics caused by deviations in the resistance and capacitance of the pseudofilter circuit 5. The automatic adjustment control voltage signal is supplied to filter circuits 11 and 12 provided in the IC 1. The circuits 11 and 12 include resistors varactor diodes as their components. The resistor and varactor diode in each of filter circuits 11 and 12 are formed in high ratio precision with respect to the resistor and varactor diode of the pseudofilter circuit, respectively. In each of filter circuits 11 and 12, the automatic adjustment control voltage signal changes the capacitance value of the varactor diode to adjust the deviation in the filter characteristics caused by deviations in the resistance and capacitance values. The input and output of the filter circuit 11 are respectively connected to IC pins 13 and 14 so as to be used outside the IC 1. The filter circuit 12 is used by the circuit within the IC 1.

Figure 4:
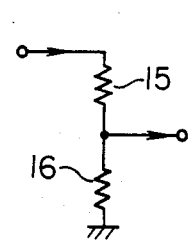
FIG. 4 shows a concrete example of a reference level generating circuit used in the filter integrated circuit of FIG. 3.
Figure 5:
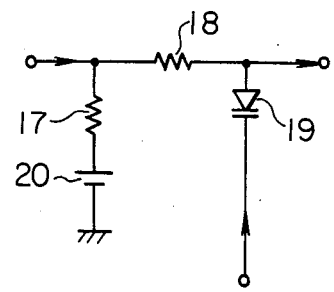
FIG. 5 shows a concrete example of a pseudofilter circuit used in the filter integrated circuit.
Figure 6:
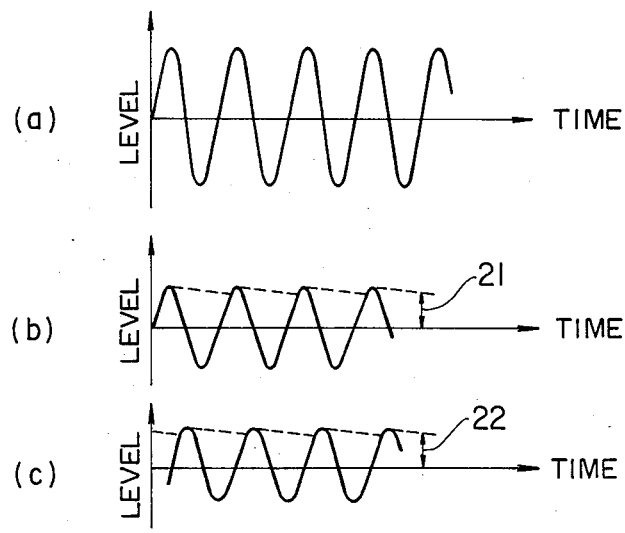
FIG. 6 shows waveforms of signals appearing at various points of the filter integrated circuit.
Figure 7:
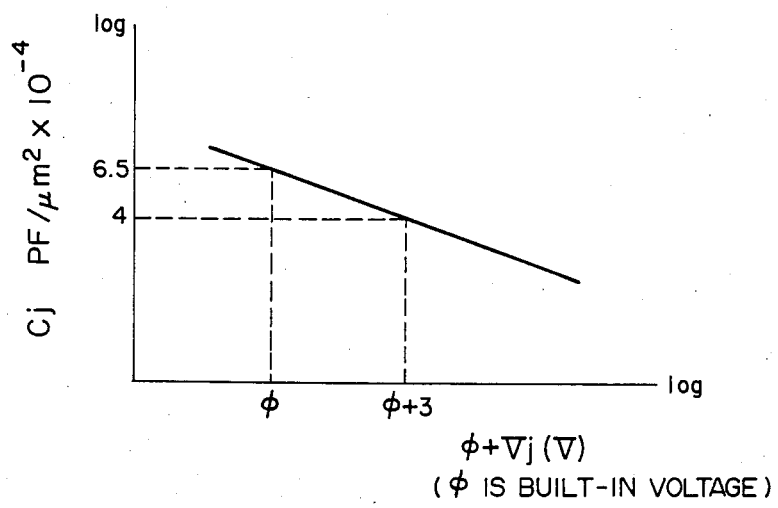
FIG. 7 is a characteristic diagram of a varactor diode used as a variable capacitor in the pseudofilter circuit.
Figure 8:
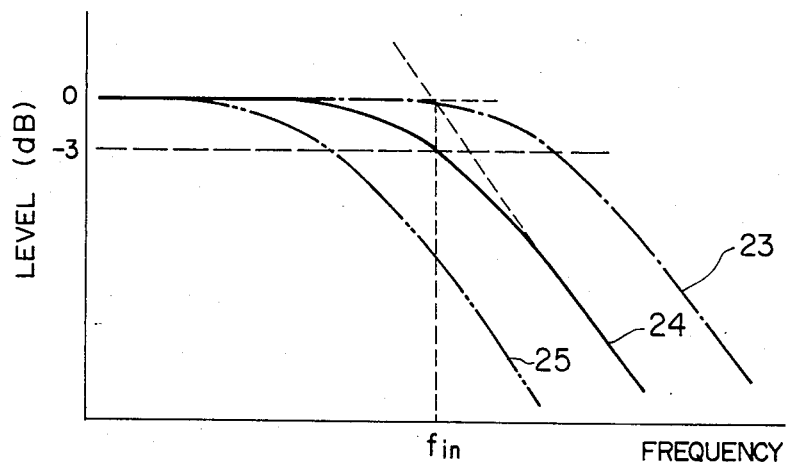
FIG. 8 shows deviations in the frequency characteristics of the pseudofilter circuit.
Figure 9:
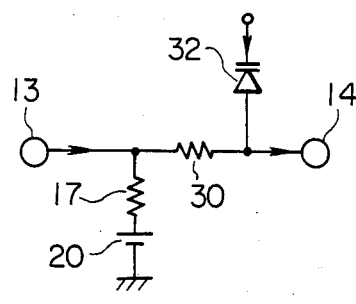
FIG. 9 shows a concrete example of a filter circuit used in the integrated circuit.
Figure 10:
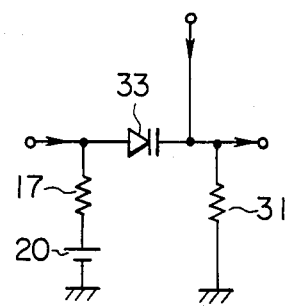
FIG. 10 shows another concrete example of a filter circuit used in the filter integrated circuit.

The embodiment of FIG. 3 will now be described in more detail. FIG. 4 shows an example of a conrete circuit of the reference level generator circuit 4 and FIG. 5 shows an example of a concrete circuit of the pseudofilter circuit 5. FIG. 6(a) shows a waveform of the input signal 2. FIG. 6(b) shows waveforms appearing at the output of the reference level generator circuit 4 and the output of the detector circuit as represented by the solid line and the broken line, respectively. FIG. 6(c) shows waveform appearing at the output of the pseudofilter circuit 5 and the output of the detector circuit 8 as represented by the solid line and the broken line, respectively. FIG. 7 shows a characteristic diagram of the varactor diode included in the pseudofilter circuit 5. FIG. 8 shows frequency characteristics of the pseudofilter circuit 5. FIG. 9 shows a concrete example of the circuit diagram of the filter circuit 11. FIG. 10 shows a concrete example of the circuit diagram of the filter circuit 12.

The reference level generator circuit 4 attenuates the input signal 3 by a constant radio with precision. The reference level generator circuit 4 can be formed by integrated resistors 15 and 16 as shown in FIG. 4, for example. Since the ratio of element values in the IC can be obtained with sufficiently high precision, the attenuation between the input and output of the reference level generator circuit 4 represented as $$\frac{\text{Output}}{\text{Input}} = \frac{R_{16}}{R_{15} + R_{16}} = \frac{1}{1 + \left(\frac{R_{15}}{R_{16}}\right)}$$

can also be realized with sufficiently high precision. The pseudofilter circuit 5 is a filter circuit including an integrated resistor and a varactor diode which serves as an integrated capacitor which has a capacitance value varied by the voltage applied thereto. For example, the pseudofilter circuit 5 can be formed by integrated resistors 17 and 18, a varactor diode 19, and a constant voltage source 20 as shown in FIG. 5. The resistance value $R_{18}$ of the integrated resistor 18 and the capacitance value $C_{19}$ of the varactor diode 19 form a CR filter of the first order. The cutoff frequency $f_c$ is represented by $$f_c = 1/2\pi R_{18} C_{19}.$$

The constant voltage source 20 applies the DC voltage to the anode of the varactor diode 19 via integrated resistors 17 and 18. On the other hand, the output voltage of the error amplifier 7 is supplied to the cathode of the varactor diode 19 in the negative feedback form.

The capacitance value of the varactor diode 19 is varied by the voltage applied across it. When the capacitance of a base-emitter junction is used as the varactor diode 19, the capacitance can be represented as $$Cj = \frac{Cj(0)}{\left(1 + \frac{Vj}{\phi}\right)^\alpha}$$

$$= Cj(0)\phi^\alpha \cdot \frac{1}{(\phi + Vj)^\alpha}$$

or $$\log Cj = K - \alpha \log (\phi + Vj)$$

where:
- Cj=base-emitter junction capacitance
- Cj (O)=base-emitter junction capacitance at zero bias
- Vj=emitter-base voltage (reverse-biased diode voltage)
- $\phi$=built-in voltage
- $\alpha$=voltage-dependent coefficient
- K=log $[Cj(0)\phi^\alpha]$ An example of characteristics of the base-emitter junction capacitance is shown in FIG. 7. When the power supply voltage is 5 V, Vj may be 0 to 3 V and Cj can be varied at least by ±20 to 25% with respect to its typical value.

The outputs of the reference level generator circuit 4 and the pseudofilter circuit 5 as represented by the solid lines of FIGS. 6(b) and 6(c) respectively are subjected to peak detection in the above described detector circuits to become signals as represented by broken lines to FIGS. 6(b) and 6(c), respectively. These output signals of the detector circuits as represented by broken lines are supplied to the error amplififer 7. As the automatic filter adjustment control voltage signal 9 which has been subjected to negative feedback, the output of the error amplifier 7 is supplied to one end of the varactor diode 19 defining the filtering characteristics of the pseudofilter circuit 5 so that the outputs of the detector circuits 6 and 8 may equal each other, i.e., levels 21 and 22 respectively as shown in FIGS. 6(b) and 6(c) may become equal to each other. By the automatic adjustment control voltage signal, the capacitance value of the varactor diode 19 is automatically varied to absorb the deviation in the pseudofilter circuit 5.

Each of two filter circuits 11 and 12 comprises an integrated resistor and a variable capacitor to attain the desired filter characteristics and is supplied with the automatic adjustment control signal 9.

Since elements integrated on one chip can be formed with high ratio precision, the deviation in the frequency characteristics of the pseudofilter circuit 5 can be made nearly equal to that of each of the filter circuits 11 and 12. Accordingly, it is possible to automatically absorb deviations in the frequency characteristics of the filter circuits 11 and 12 by using the automatic adjustment control signal 9.

The operation of the circuit of FIG. 3 will now be described in more detail. It is now assumed that the integrated resistors 15 and 16 are defined so that the reference level generator circuit 4 has an attenuation loss of 3 dB. If the sum of deviations of the integrated resistor and the varactor diode is −20%, the pseudofilter circuit 5 has characteristics as represented by 23 FIG. 8. If the input signal 3 having a frequency fin is then supplied to the circuit 3, the output of the pseudofilter circuit 5 becomes larger than that of the reference level generator circuit 4. And the outputs of the pseudofilter circuit 5 and the reference level generator circuit 4 are fed back to the pseudofilter circuit 5 via the detector circuits 6 and 8 as well as the error amplifier 7 so as to reduce the voltage applied to the varactor diode of the pseudofilter circuit 5. Since the decrease in the voltage applied to the varactor diode increases the capacitance value as shown in FIG. 7, the frequency characteristics 23 of FIG. 8 is shifted to the left to produce the frequency characteristics 24 of FIG. 8. That is to say, the capacitance value of the variable capacitor is so varied that the outputs of the reference level generator circuit 4 and the pseudofilter circuit 5 may become equal to each other at the frequency fin. Since the capacitance value of the varactor diode varies by ±20 to 25% in accordance with Vj, the maximum deviation can be absorbed. If the total deviation of the integrated resistor and the varactor diode is the maximum value of +20%, the pseudofilter circuit 5 assumes characteristics 25 as illustrated in FIG. 8. In this case, it is a matter of course that the pseudofilter circuit 5 has eventually the frequency characteristics 24 of FIG. 8 upon receiving the fin input.

As described above, the automatic adjustment control signal 9 for automatically absorbing the deviations of the integrated resistor 18 and the varactor diode 19 is obtained. Because of existence on the same chip, the integrated resistor 18 and the varactor diode 19 can be formed with sufficiently high ratio precision with respect to the integrated resistors 30 and 31 and the varactor diodes 32 and 33 illustrated in FIGS. 9 and 10, respectively. Cutoff frequencies $f_c$ (11) and $f_c$ (12) of the filter circuits 11 and 12 exemplified in FIGS. 9 and 10 are represented as $$f_c(11) = \frac{1}{2\pi R_{30} C_{32}} \approx \frac{1}{2\pi n_1 n_2 R_{18} C_{19}}$$

and $$f_c(12) = \frac{1}{2\pi R_{31} C_{33}} = \frac{1}{2\pi n_3 n_4 R_{18} C_{19}}$$

where $n_1$ to $n_4$ are constants. Thus, deviations in the filter circuits 11 and 12 can be automatically absorbed, resulting in integrated filters requiring no adjustments.

Further, since the reference of the negative feedback is the attenuation $$\frac{1}{1 + \left(\frac{R_{15}}{R_{16}}\right)}$$

of the reference level generator circuit 4 as described above, the filter characteristics depend upon neither the temperature, nor the power supply voltage, nor the level change of the input signal 3. As a result, desired stable filter characteristics can always be attained.

In the embodiments described above, the input signal 3 is supplied outside the IC 1. However, it is a matter of course that the similar effect can be obtained even if the input signal 3 is supplied from a circuit contained in the same IC. In the video tape recorder, for example, a conrete signal source is the chrominance subcarrier (3.58 MHz in NTSC) generated with high precision in the color signal processing circuit by using a crystal oscillator.

In the above description, the detector circuits 6 and 7 send out the half-wave rectified waveforms. If full-wave rectified waveforms are subjected to peak detection, more stabel filter circuits can be realized.

Figure 11:
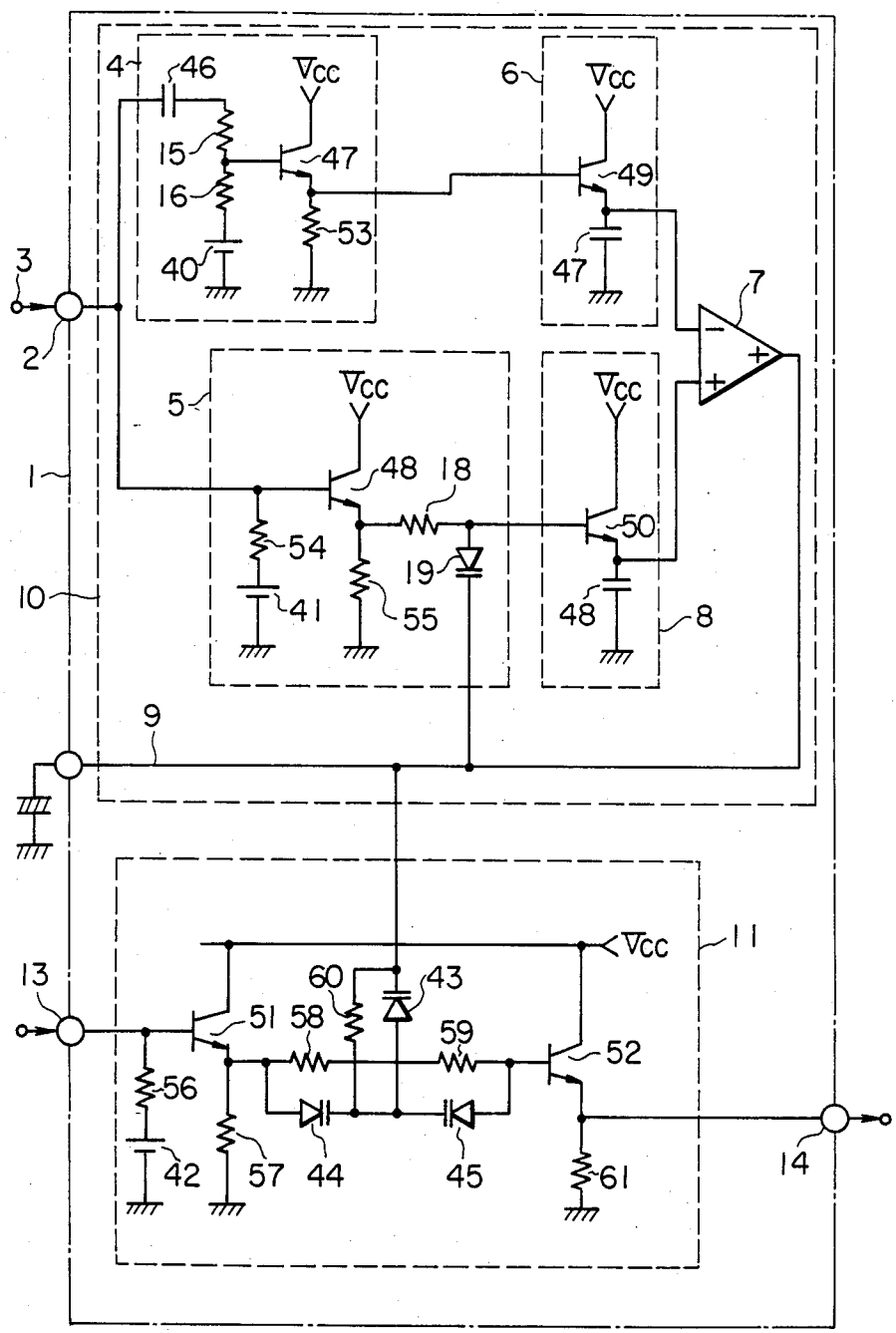
FIG. 11 is a circuit diagram of another embodiment of a filter integrated circuit according to the present invention.

FIG. 11 shows another embodiment of the present invention. Reference numerals that are like reference numerals in FIG. 3 refer to like components. Constant voltage sources 40, 41 and 42 supply the same voltage. This voltage minus the base-emitter voltage of a transistor which is approximately 0.7 V is supplied to anode sides of the varactor diodes 19, 43, 44 and 45 and also supplied to the detector circuits 6 and 8. Reference numerals 46 to 48 denote integrated capacitors. Reference numerals 47 to 52 and 53 to 61 denote npn transistors and integrated resistors, respectively.

A filter circuit 11 is a twin-T-shaped trap filter described before. If elements are selected as $$R_{58} = R_{59} 2 R_{60} = R_b$$

$$C_{44} = C_{45} = C_{43}/2 = C_b$$

then the trap frequency fr can be represented as $$f_r = 1/2\pi R_b C_b.$$

Since the elements on one chip can be realize with high ratio precision, $R_b$ and $C_b$ can be represented as $$R_b = n_5 R_{18}$$

and $$C_b = n_6 C_{19}$$

where $n_5$ and $n_6$ are constants. Thus, it allows that $$f_r = 1/2\pi n_5 n_6 R_{18} C_{19}.$$

By the automatic adjustment of the pseudofilter circuit 5, the component deviations in the twin-T-shaped circuit can also be absorbed without requiring any adjustment.

Figure 12:
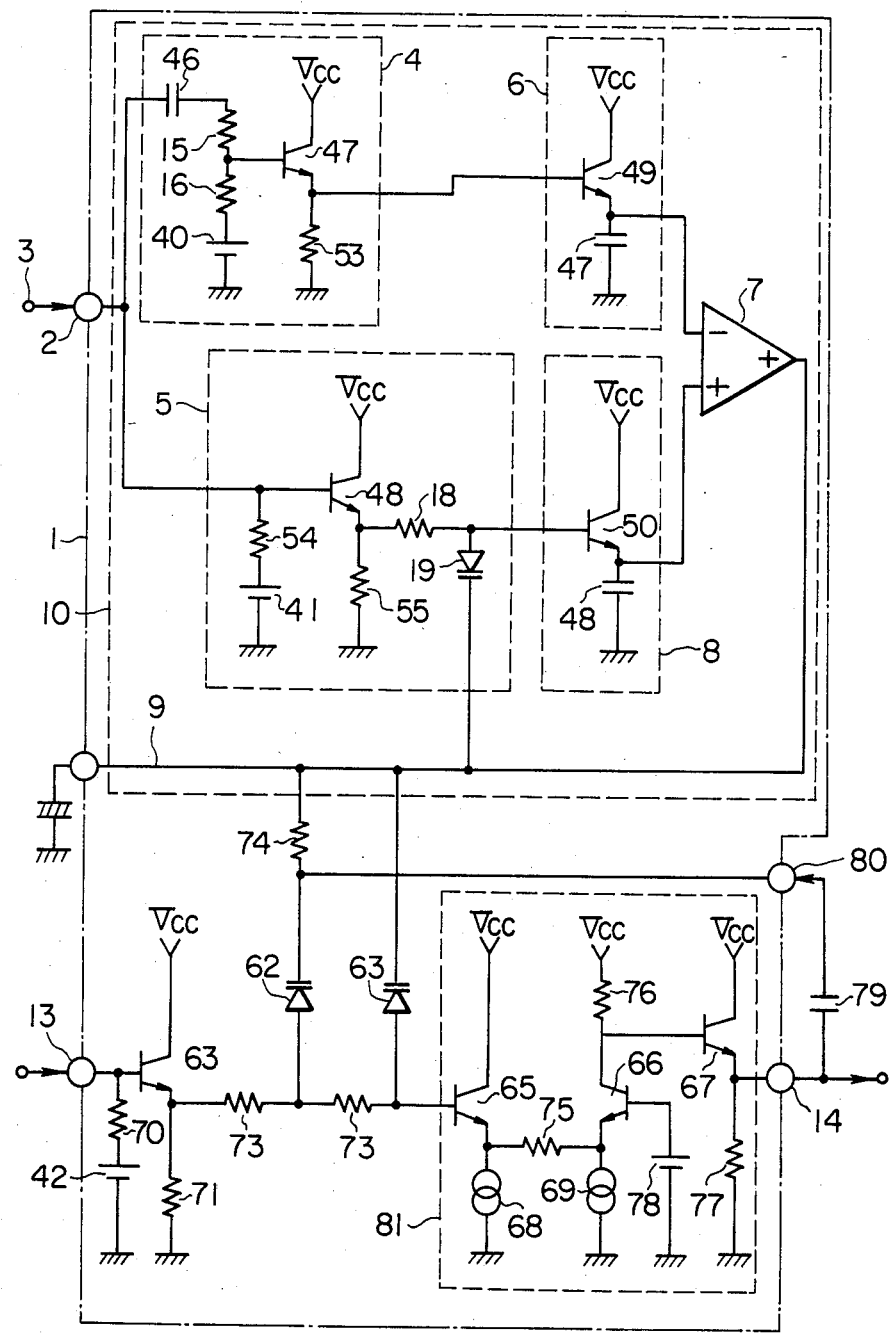
FIG. 12 is a circuit diagram of still another embodiment of a filter integrated circuit according to the present invention.

FIG. 12 shows still another embodiment of the present invention. Reference numerals that are like reference numerals in FIGS. 3 and 11 refer to like components. Varactor diodes 62 and 63, npn transistors 64 to 67, constant current sources 68 and 69, integrated resistors 70 to 77, a constant voltage source 78, and AC signal bypassing capacitor 79, and an IC pin 80 are shown in FIG. 12. A resistor 74 having a high resistance value is used to supply bias voltage for passing only the DC voltage signal. Since the resistor 74 has a high resistance value, an AC signal flowing through the resistor 74 is largely attenuated as compared with the AC signal flowing to the varactor diodes 62 through the capacitance 79 and is neglizible. The automatic adjustment control signal from the error amplifier circuit 7 is supplied to the varactor diode 62 through the resistor 74. Reference numeral 81 denotes a differential amplifier. The differential amplifier 81 constitutes a positive feedback type lowpass filter of the second order in conjunction with resistors 72 and 73 as well as varactor diodes 62 and 63. The effects of the present invention described before are obtained in this embodiment as well.

In the embodiment of FIG. 12, the filter circuit forms a lowpass filter. As an alternative, a highpass filter or a bandpass filter may be used. In this case, the pseudofilter circuit is formed similarly to FIG. 12. And the capacitance value of the varactor diodes included in the filter circuit comprising the highpass filter or the bandpass filter is changed by the automatic adjustment control signal so as to correct the deviation in the filter characteristics.

In the above described embodiments, the input signal has a constant frequency. However, an input signal having a variable frequency may also be used.

While particular embodiments of the invention have been shown and described, it will be obvious to those skilled in the art that various changes and modifications may be made without departing from the present invention in the broader aspect.

We claim:

1. A filter integrated circuit including at least a resistor and a capacitor comprising:
   a reference level generator circuit for attenuating an input signal and generating a reference level signal;
   a pseudofilter circuit for filtering said input signal, said pseudofilter circuit including a resistor and a variable capacitor as filter elements;
   a detector circuit for detecting the output signal of said reference level generator circuit;
   another detector circuit for detecting the output signal of said pseudofilter circuit;
   an error amplifier for receiving the output signals of said detector circuits, comparing signal levels of both output signals, and producing an automatic adjustment control signal in accordance with the difference between said signal level;
   means for supplying said automatic adjustment control signal from said error amplifier to said pseudofilter circuit for changing the cpacitance value of said variable capacitor to reduce said signal level difference; and
   a filter circuit including a resistor and a variable capacitor formed with high ratio precision with respect to filter elements of said peudofilter circuit, wherein said filter circuit is also coupled to said means for supplying said automatic adjustment control signal so that the cpacitance value of said variable capacitor of said filter circuit is changed by said automatic adjustment control signal to change the filter characteristics of said filter circuit.

2. A filter integrated circuit according to claim 1, wherein said variable capacitors of said pseudofilter circuit and said filter circuit are comprised of varactor diodes.

3. A filter integrated circuit according to claim 1, wherein said reference level generator circuit comprises resistors, said pseudofilter circuit comprises resistors and variable capacitors, and said filter circuit comprises resistors and variable capacitors, said respective circuits being formed on the same integrated circuit substrate.

4. A filter integrated circuit according to claim 1, wherein said reference level generator circuit, said pseudofilter circuit, and said filter circuit further comprises transistors as active components, respectively, said respective circuits being formed on the same integrated circuit substrate.

* * * * *